United States Patent
Liaw

(10) Patent No.: US 12,213,296 B2
(45) Date of Patent: Jan. 28, 2025

(54) IC INCLUDING STANDARD CELLS AND SRAM CELLS

(71) Applicant: Taiwan Semiconductor Manufacturing Company, Ltd., Hsinchu (TW)

(72) Inventor: Jhon-Jhy Liaw, Zhudong Township (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/361,185

(22) Filed: Jul. 28, 2023

(65) Prior Publication Data

US 2023/0389253 A1    Nov. 30, 2023

Related U.S. Application Data

(63) Continuation of application No. 17/377,672, filed on Jul. 16, 2021, now Pat. No. 11,792,970, which is a
(Continued)

(51) Int. Cl.

| | |
|---|---|
| *H01L 27/092* | (2006.01) |
| *H01L 27/02* | (2006.01) |
| *H01L 29/08* | (2006.01) |
| *H01L 29/10* | (2006.01) |
| *H01L 29/165* | (2006.01) |

(Continued)

(52) U.S. Cl.
CPC ......... *H10B 10/12* (2023.02); *H01L 27/0207* (2013.01); *H01L 27/0924* (2013.01); *H01L 29/0847* (2013.01); *H01L 29/1037* (2013.01); *H01L 29/165* (2013.01); *H01L 29/167* (2013.01); *H01L 29/36* (2013.01); *H01L 29/7848* (2013.01); *H01L 29/7851* (2013.01); *H10B 10/18* (2023.02); *H01L 27/11807* (2013.01); *H01L 29/161* (2013.01)

(58) Field of Classification Search
CPC .............. H01L 27/0924; H01L 29/785; H01L 29/7848
See application file for complete search history.

(56) References Cited

U.S. PATENT DOCUMENTS

| | | |
|---|---|---|
| 10,475,800 B2 | 11/2019 | Liaw |
| 11,075,208 B2 | 7/2021 | Liaw |

(Continued)

*Primary Examiner* — Mark V Prenty
(74) *Attorney, Agent, or Firm* — McClure, Qualey & Rodack, LLP

(57) ABSTRACT

An integrated circuits (IC) includes a standard cell array and a SRAM cell array. The standard cell array includes standard cells having first P-type transistors arranged in a first column of the standard cell array and a first fin structure shared by the first P-type transistors. The SRAM cell array includes SRAM cells having second P-type transistors arranged in a second column of the SRAM cell array and second fin structures arranged in the second column. Each of the second fin structures is shared by two adjacent second P-type transistors respectively disposed in two adjacent SRAM cells. A material of the first fin structure is different from a material of the second fin structures. A dimension of the first fin structure along the first column is greater than a dimension of each of the second fin structures along the second column.

20 Claims, 12 Drawing Sheets

Related U.S. Application Data continuation of application No. 16/654,164, filed on Oct. 16, 2019, now Pat. No. 11,075,208, which is a continuation of application No. 15/718,344, filed on Sep. 28, 2017, now Pat. No. 10,475,800.

(51) Int. Cl.
*H01L 29/167*   (2006.01)
*H01L 29/36*    (2006.01)
*H01L 29/78*    (2006.01)
*H10B 10/00*    (2023.01)
H01L 27/118    (2006.01)
H01L 29/161    (2006.01)

(56) References Cited

U.S. PATENT DOCUMENTS 11,792,970 B2 * 10/2023 Liaw .................. H01L 27/0924
2019/0096891 A1   3/2019 Liaw \* cited by examiner

IC INCLUDING STANDARD CELLS AND SRAM CELLS

CROSS REFERENCE TO RELATED APPLICATIONS

This Application is a Continuation of U.S. application Ser. No. 17/377,672, filed on Jul. 16, 2021, which is a Continuation of U.S. application Ser. No. 16/654,164, filed on Oct. 16, 2019 (now U.S. Pat. No. 11,075,208, issued on Jul. 27, 2021), which is a Continuation of U.S. application Ser. No. 15/718,344, filed on Sep. 28, 2017, now U.S. Pat. No. 10,475,800, the entirety of which are incorporated by reference herein.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometric size (i.e., the smallest component that can be created using a fabrication process) has decreased.

Static Random Access Memory (SRAM) is commonly used in integrated circuits. SRAM cells have the advantageous feature of being able to hold data without the need to refresh. With the increasingly demanding requirements on the speed of integrated circuits, the read speed and write speed of SRAM cells have also become more important. With increased down-scaling of the already very small SRAM cells, however, such requests are difficult to achieve.

BRIEF DESCRIPTION OF THE DRAWINGS

Aspects of the present disclosure are best understood from the following detailed description when read with the accompanying figures. It should be noted that, in accordance with the standard practice in the industry, various nodes are not drawn to scale. In fact, the dimensions of the various nodes may be arbitrarily increased or reduced for clarity of discussion.

DETAILED DESCRIPTION

Figure 1A:
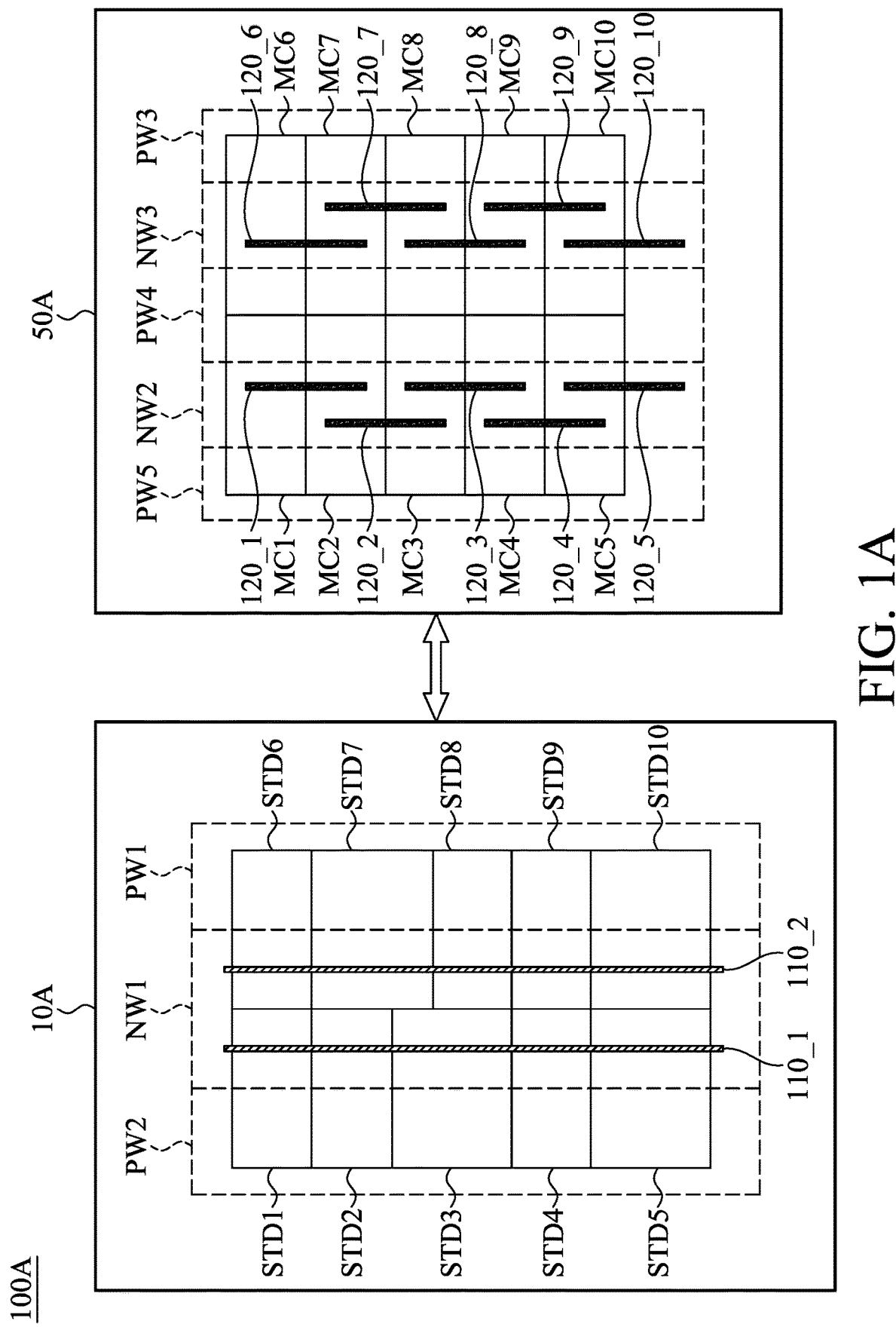
FIG. 1A is a simplified diagram of an integrated circuit (IC), in accordance with some embodiments of the disclosure.

The following disclosure provides many different embodiments, or examples, for implementing different nodes of the subject matter provided. Specific examples of components and arrangements are described below to simplify the present disclosure. These are, of course, merely examples and are not intended to be limiting. In some embodiments, the formation of a first node over or on a second node in the description that follows may include embodiments in which the first and the second nodes are formed in direct contact, and may also include embodiments in which additional nodes may be formed between the first and the second nodes, such that the first and the second nodes may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and/or after a disclosed method, and some of the operations described can be replaced or eliminated for other embodiments of the method.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

For fin field effect transistors (FinFETs), the fins may be patterned using any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The fins provide additional sidewalls device width (for Ion performance) as well as better short channel control (for subthreshold leakage). Therefore, because of their superior scalability by double gate mode operation, FinFETs are expected to be advantageous in terms of gate-length scaling and intrinsic threshold voltage (Vt) fluctuation.

Integrated circuits and the corresponding structures are provided in accordance with various exemplary embodiments. Some variations of some embodiments are discussed. Throughout the various views and illustrative embodiments, like reference numbers are used to designate like elements.

FIG. 1A is a simplified diagram of an integrated circuit (IC) 100A, in accordance with some embodiments of the disclosure. The IC 100A includes a digital circuit (or so-called a logic circuit) 10A and a SRAM 50A. In some embodiments, the digital circuit 10A is configured to access the SRAM 50A to perform various applications. In some embodiments, the SRAM 50A is accessed by a controller of the IC and the digital circuit 10A is capable of performing various applications according to data stored in the SRAM 50A and accessed by the controller.

The digital circuit 10A includes a cell array formed by multiple standard cells STD1-STD10 (e.g., inverter, NAND, NOR, Flip-Flop, latch, and so on), and the standard cells STD1-STD10 are arranged in multiple rows and multiple columns of the cell array. For example, the standard cells STD1-STD5 are arranged in the same column, and the standard cells STD1-STD5 have the same cell width. The standard cells STD6-STD10 are arranged in the same column, and the standard cells STD6-STD10 have the same cell width. In some embodiments, different types of standard cells STD1-STD10 may have various widths and heights.

Each of the standard cells STD1-STD10 is formed by N-type and P-type fin field effect transistors (FinFETs). The N-type FinFETs of the standard cells STD6-STD10 are formed in a P-type well region PW1 of a substrate, and the N-type FinFETs of the standard cells STD1-STD5 are formed in a P-type well region PW2 of the substrate. An N-type well region NW1 is arranged between the P-type well regions PW1 and PW2. The P-type FinFETs of the standard cells STD1-STD10 are formed in the N-type well region NW1 of the substrate. Furthermore, the P-type FinFETs of the standard cells STD1-STD5 share a semiconductor fin 110_1, and the P-type FinFETs of the standard cells STD6-STD10 share a semiconductor fin 110_2. The semiconductor fins 110_1 and 110_2 are continuous fin lines including silicon germanium (SiGe) material, and the semiconductor fin 110_1 is parallel to the semiconductor fin 110_2. In the logic circuit 10A, the channel of each P-type FinFET is formed by a single semiconductor fin. In some embodiments, the channel of each P-type FinFET can be formed by multiple semiconductor fins.

The SRAM 50A includes a cell array formed by multiple SRAM cells (also called bit cells) MC1-MC10, and the SRAM cells MC1-MC10 are arranged in multiple rows and multiple columns in the cell array. For example, the SRAM cells MC1-MC5 are arranged in the same column, and the SRAM cells MC6-MC10 are arranged in the same column. The SRAM cells have the same configurations in layout, e.g., the widths and heights of the SRAM cells are the same. The configurations of the SRAM cells are described below.

Each of the SRAM cells MC1-MC10 is formed by N-type and P-type FinFETs. The N-type FinFETs of the SRAM cells MC1-MC5 are formed in the P-type well regions PW4 and PW5 of the substrate, and P-type FinFETs of the SRAM cells MC1-MC5 are formed in an N-type well region NW2 of the substrate. The N-type FinFETs of the SRAM cells MC6-MC10 are formed in the P-type well regions PW3 and PW4 of the substrate, and the P-type FinFETs of the SRAM cells MC6-MC10 are formed in an N-type well region NW3 of the substrate. The N-type well region NW3 is positioned between the P-type well regions PW3 and PW4, the P-type well region PW4 is positioned between the N-type well regions NW2 and NW3, and the N-type well region NW2 is positioned between the P-type well regions PW4 and PW5.

In the SRAM 50A, the P-type FinFETs of the two adjacent SRAM cells can share a semiconductor fin. Taking the SRAM cells MC1-MC5 arranged in the same column as an example, a half of the P-type FinFETs of the SRAM cell MC1 and a half of the P-type FinFETs of the SRAM cell MC2 share a semiconductor fin 120_1. The other half of the P-type FinFETs of the SRAM cell MC2 and a half of the P-type FinFETs of the SRAM cell MC3 share a semiconductor fin 120_2. The other half of the P-type FinFETs of the SRAM cell MC3 and a half of the P-type FinFETs of the SRAM cell MC4 share a semiconductor fin 120_3. The other half of the P-type FinFETs of the SRAM cell MC4 and a half of the P-type FinFETs of the SRAM cell MC5 share a semiconductor fin 120_4, and so on. Furthermore, the semiconductor fins 120_1-120_10 are discontinuous fin lines including non-SiGe material. The semiconductor fins 120_1, 120_3 and 120_5 are arranged in the same line. The semiconductor fins 120_2 and 120_4 are arranged in the same line parallel to the semiconductor fins 120_1, 120_3 and 120_5. The semiconductor fins 1206, 120_8 and 120_10 are arranged in the same line. The semiconductor fins 120_7 and 120_9 are arranged in the same line parallel to the semiconductor fins 120_6, 120_8 and 120_10. In some embodiments, the semiconductor fins 120_1-120_10 are formed by silicon (Si) material (e.g., non-SiGe material).

In the IC 100A, the semiconductor fins of the P-type FinFETs of the logic circuit 10A and the semiconductor fins of the P-type FinFETs of the SRAM 50A are formed of different materials. For example, the P-type FinFETs of the standard cells STD1-STD10 of the logic circuit 10A are formed by the SiGe content continuous semiconductor fins, and the P-type FinFETs of the SRAM cells MC1-MC10 of the SRAM 50A are formed by the non-SiGe content discontinuous semiconductor fins. Therefore, in the IC 100A, the semiconductor fins 120_1-120_10 of the SRAM 50A are shorter than the semiconductor fins 110_1-110_2 of the logic circuit 10A.

Figure 1B:
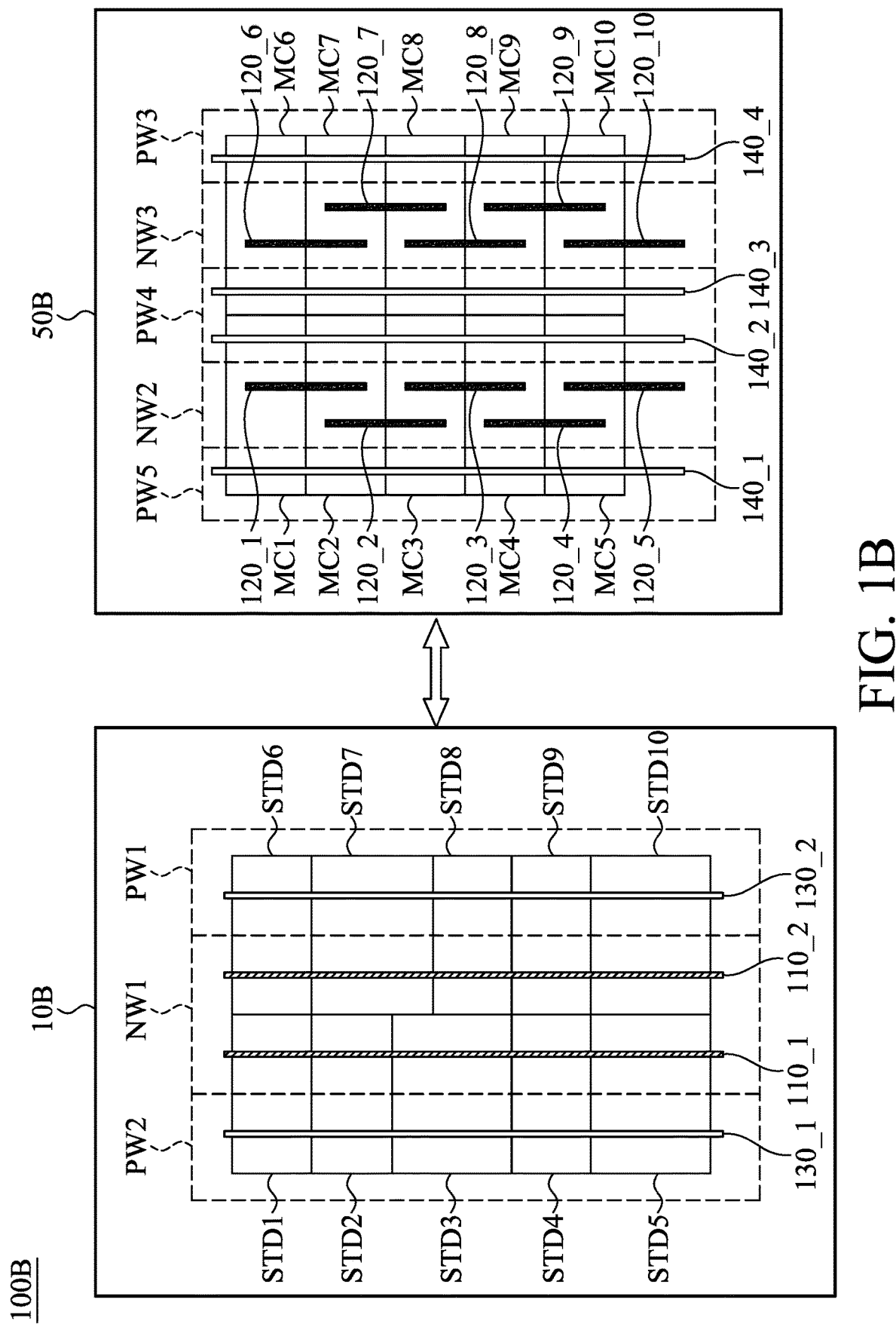
FIG. 1B is a simplified diagram of an IC, in accordance with some embodiments of the disclosure.

FIG. 1B is a simplified diagram of an IC 100B, in accordance with some embodiments of the disclosure. The IC 100B includes a digital circuit 10B and a SRAM 50B. In some embodiments, the digital circuit 10B is configured to access the SRAM 50B to perform various applications. In some embodiments, the SRAM 50B is accessed by a controller of the IC and the digital circuit 10B is capable of performing various applications according to data stored in the SRAM 50B and accessed by the controller.

Compared with the logic circuit 10A of FIG. 1A, the N-type FinFETs of the standard cells STD1-STD5 share a semiconductor fin 130_1, and the N-type FinFETs of the standard cells STD6-STD10 share a semiconductor fin 130_2. The semiconductor fins 130_1 and 130_2 are continuous fin lines including Si, and the semiconductor fin 130_1 is parallel to the semiconductor fin 130_2. Furthermore, the semiconductor fin 130_1 is also parallel to the semiconductor fins 110_1 and 110_2. In the logic circuit 10B, the channel of each N-type FinFET is formed by a single semiconductor fin. In some embodiments, the channel of each N-type FinFET can be formed by multiple semiconductor fins. In some embodiments, the semiconductor fins 110_1, 110_2, 130_1 and 130_2 have the same length.

Compared with the SRAM 50A of FIG. 1A, the N-type FinFETs formed in the P-type well region PW5 of the SRAM cells MC1-MC5 share a semiconductor fin 140_1, and the N-type FinFETs formed in the P-type well region PW4 of the SRAM cells MC6-MC10 share a semiconductor fin 140_2. Furthermore, the N-type FinFETs formed in the P-type well region PW4 of the SRAM cells MC6-MC10 share a semiconductor fin 140_3, and the N-type FinFETs formed in the P-type well region PW3 of the SRAM cells MC6-MC10 share a semiconductor fin 140_4. The semiconductor fins 140_1-140_4 are continuous fin lines including Si, and the semiconductor fins 140_1-140_4 are parallel to each other. Furthermore, the semiconductor fins 140_1-140_4 are also parallel to the semiconductor fins 120_1-120_10. In the SRAM 50B, the channel of each N-type FinFET is formed by a single semiconductor fin. In some embodiments, the channel of each N-type FinFET can be formed by multiple semiconductor fins.

In some embodiments, the semiconductor fins 130_1 and 130_2 of the logic circuit 10B and the semiconductor fins 140_1 and 140_2 of the SRAM 50B are continuous fin lines including non-SiGe material.

Figure 2:
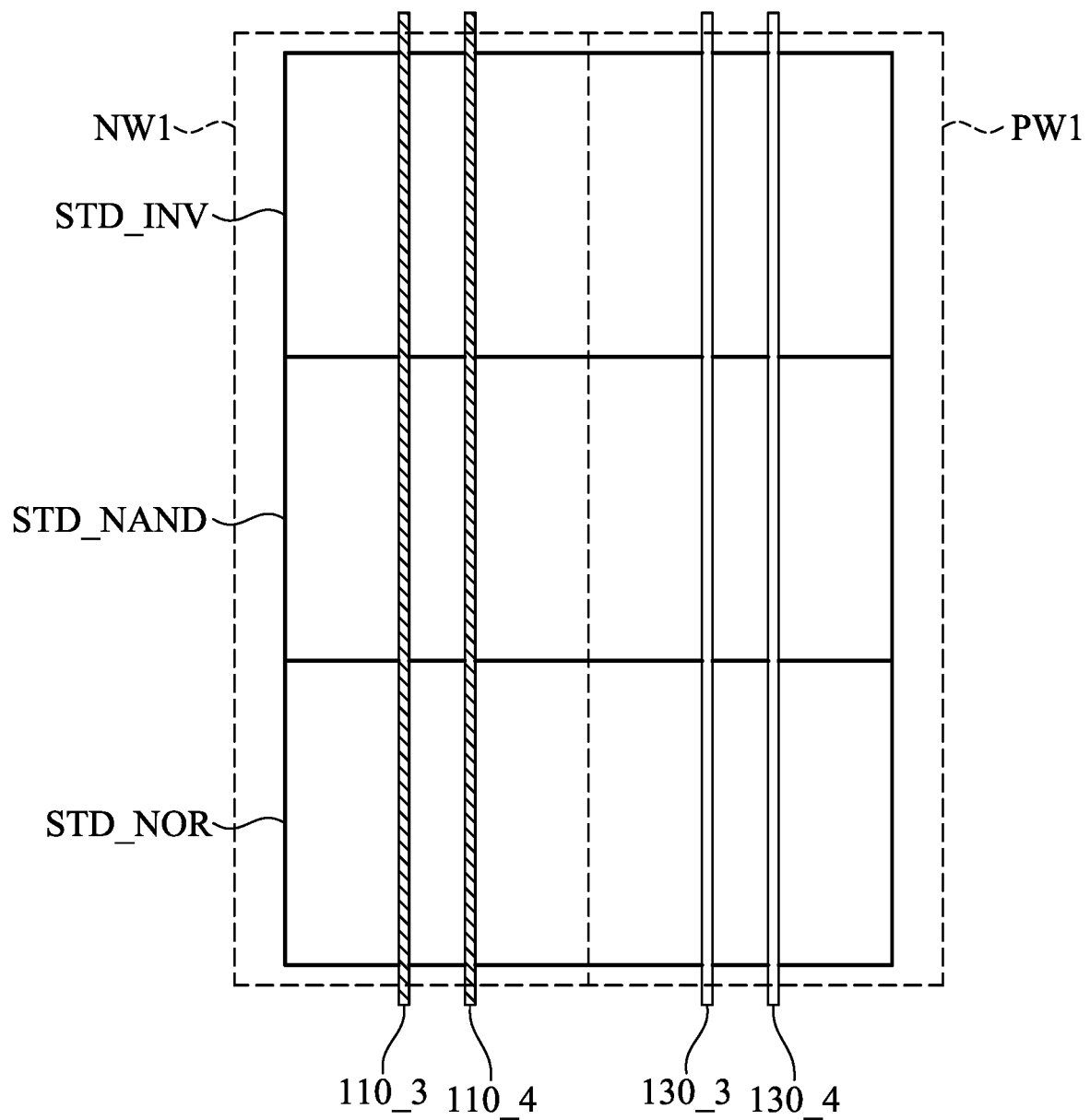
FIG. 2 is a simplified diagram of a logic circuit 10C, in accordance with some embodiments of the disclosure.

FIG. 2 is a simplified diagram of a logic circuit 10C, in accordance with some embodiments of the disclosure. The digital circuit 10C includes the standard cells STD_INV, STD_NAND, and STD_NOR arranged in the same column. The P-type FinFETs of the standard cells STD_INV, STD_NAND, and STD_NOR are formed in the N-type well region NW1, and the channel of each P-type FinFET is formed by dual semiconductor fins 110_3 and 110_4. Moreover, the N-type FinFETs of the standard cells STD_INV, STD_NAND, and STD_NOR are formed in the P-type well region PW1, and the channel of each N-type FinFET is formed by dual semiconductor fins 130_3 and 130_4.

Figure 3A:
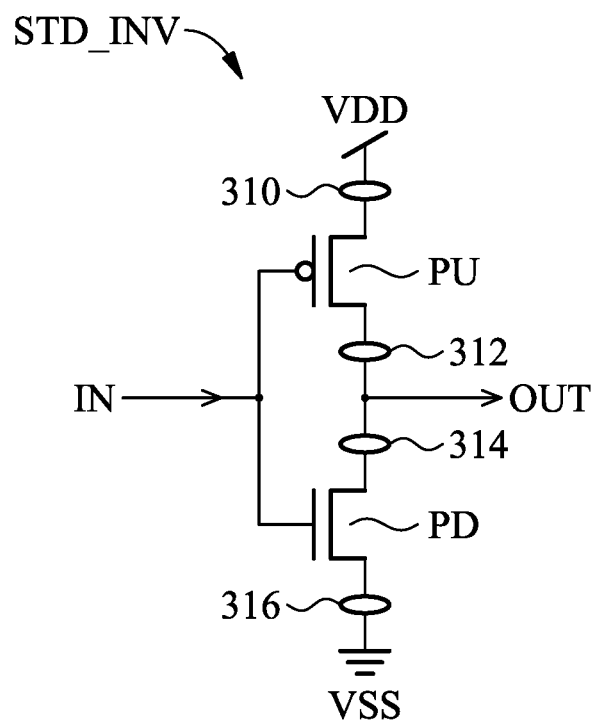
FIG. 3A is a schematic diagram illustrating the standard cell STD_INV of FIG. 2.

FIG. 3A is a schematic diagram illustrating the standard cell STD_INV of FIG. 2. The standard cell STD_INV is an inverter including a P-type FinFET PU and an N-type FinFET PD, and the inverter is capable of receiving an input signal IN to provide an output signal OUT. A source of the P-type FinFET PU is coupled to a power line VDD (or a power supply node) through a node 310, and a drain of the P-type FinFET PU is coupled to the N-type FinFET PD through a node 312. A source of the N-type FinFET PD is coupled to a ground line VSS through a node 316, and a drain of the N-type FinFET PD is coupled to the P-type FinFET PU through a node 314. The gates of the P-type FinFET PU and the N-type FinFET PD are coupled together for receiving the input signal IN, and the drains of the P-type FinFET PU and the N-type FinFET PD are coupled together through the nodes 312 and 314 for providing the output signal OUT.

Figure 3B:
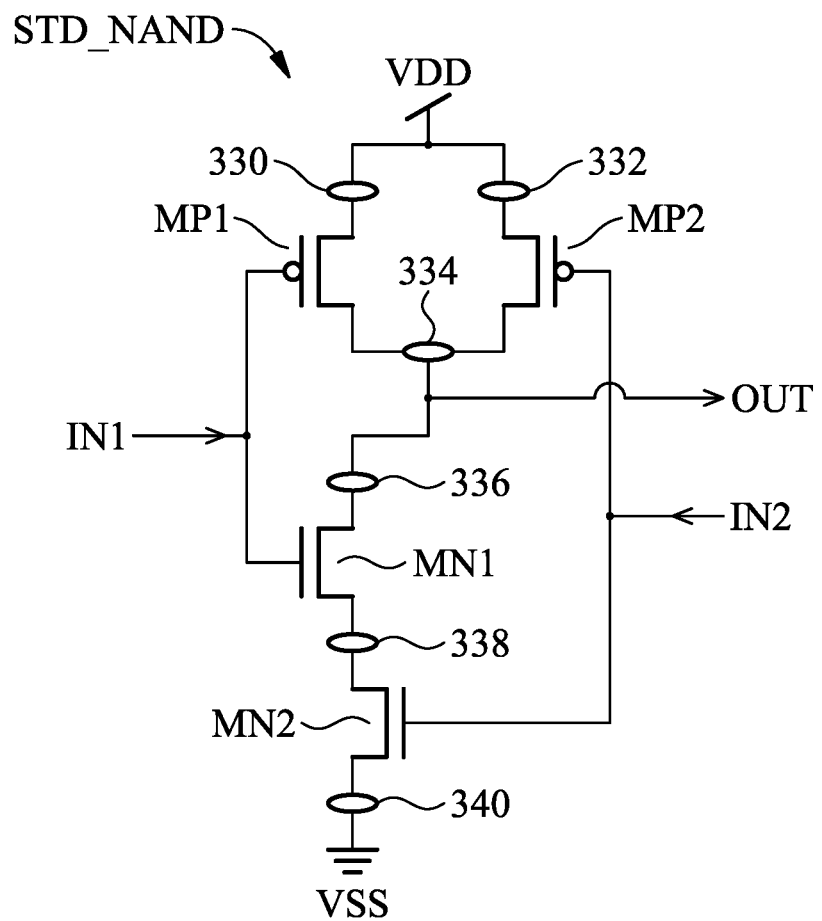
FIG. 3B is a schematic diagram illustrating the standard cell STD_NAND of FIG. 2.

FIG. 3B is a schematic diagram illustrating the standard cell STD_NAND of FIG. 2. The standard cell STD_NAND is a NAND gate including the P-type FinFETs MP1 and MP2 and the N-type FinFETs MN1 and MN2, and the NAND gate is capable of receiving two input signals IN1 and IN2 to provide an output signal OUT. The sources of the P-type FinFETs MP1 and MP2 are coupled to a power line VDD through the nodes 330 and 332, respectively. Both the drains of the P-type FinFETs MP1 and MP2 are coupled to the N-type FinFET MN1 through a node 334. A source of the N-type FinFET MN2 is coupled to a ground line VSS through a node 340, and a drain of the N-type FinFET MN2 is coupled to the N-type FinFET MN1 through a node 338. A source of the N-type FinFET MN1 is coupled to the N-type FinFET MN2 through the node 338, and a drain of the N-type FinFET MN1 is coupled to the P-type FinFETs MP1 and MP2 through a node 336. Specifically, the P-type FinFETs MP1 and MP2 are coupled in parallel, and the N-type FinFETs MN1 and MN2 are coupled in series. The gates of the P-type FinFET MP1 and the N-type FinFET MN1 are coupled together for receiving the input signal IN1, and the gates of the P-type FinFET MP2 and the N-type FinFET MN2 are coupled together for receiving the input signal IN2. The drains of the P-type FinFETs MP1 and MP2 and the N-type FinFET MN1 are coupled together through the nodes 334 and 336 for providing the output signal OUT.

Figure 3C:
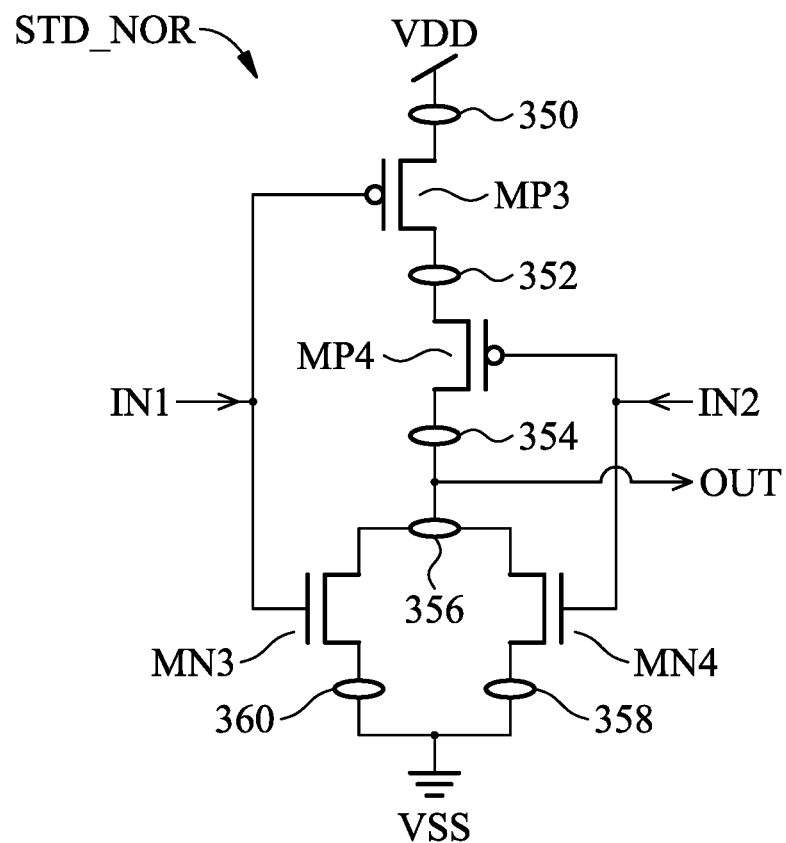
FIG. 3C is a schematic diagram illustrating the standard cell STD_NOR of FIG. 2.

FIG. 3C is a schematic diagram illustrating the standard cell STD_NOR of FIG. 2. The standard cell STD_NOR is an NOR gate including the P-type FinFETs MP3 and MP4 and the N-type FinFETs MN3 and MN4, and the NOR gate is capable of receiving two input signals IN1 and IN2 to provide an output signal OUT. A source of the P-type FinFET MP3 is coupled to a power line VDD through a node 350, and a drain of the P-type FinFET MP3 is coupled to the P-type FinFET MP4 through a node 352. A source of the P-type FinFET MP4 is coupled to the P-type FinFET MP3 through the node 352, and a drain of the P-type FinFET MP4 is coupled to the N-type FinFETs MN3 and MN4 through a node 354. The sources of the N-type FinFETs MN3 and MN4 are coupled to a ground line VSS through the nodes 360 and 358, respectively. Both the drains of the N-type FinFETs MN3 and MN4 are coupled to the P-type FinFET MP4 through a node 356. Specifically, the P-type FinFETs MP3 and MP4 are coupled in series, and the N-type FinFETs MN3 and MN4 are coupled in parallel. The gates of the P-type FinFET MP3 and the N-type FinFET MN3 are coupled together for receiving the input signal IN1, and the gates of the P-type FinFET MP4 and the N-type FinFET MN4 are coupled together for receiving the input signal IN2. The drains of the N-type FinFETs MN3 and MN4 and the P-type FinFET MP4 are coupled together through the nodes 356 and 354 for providing the output signal OUT.

Figure 4:
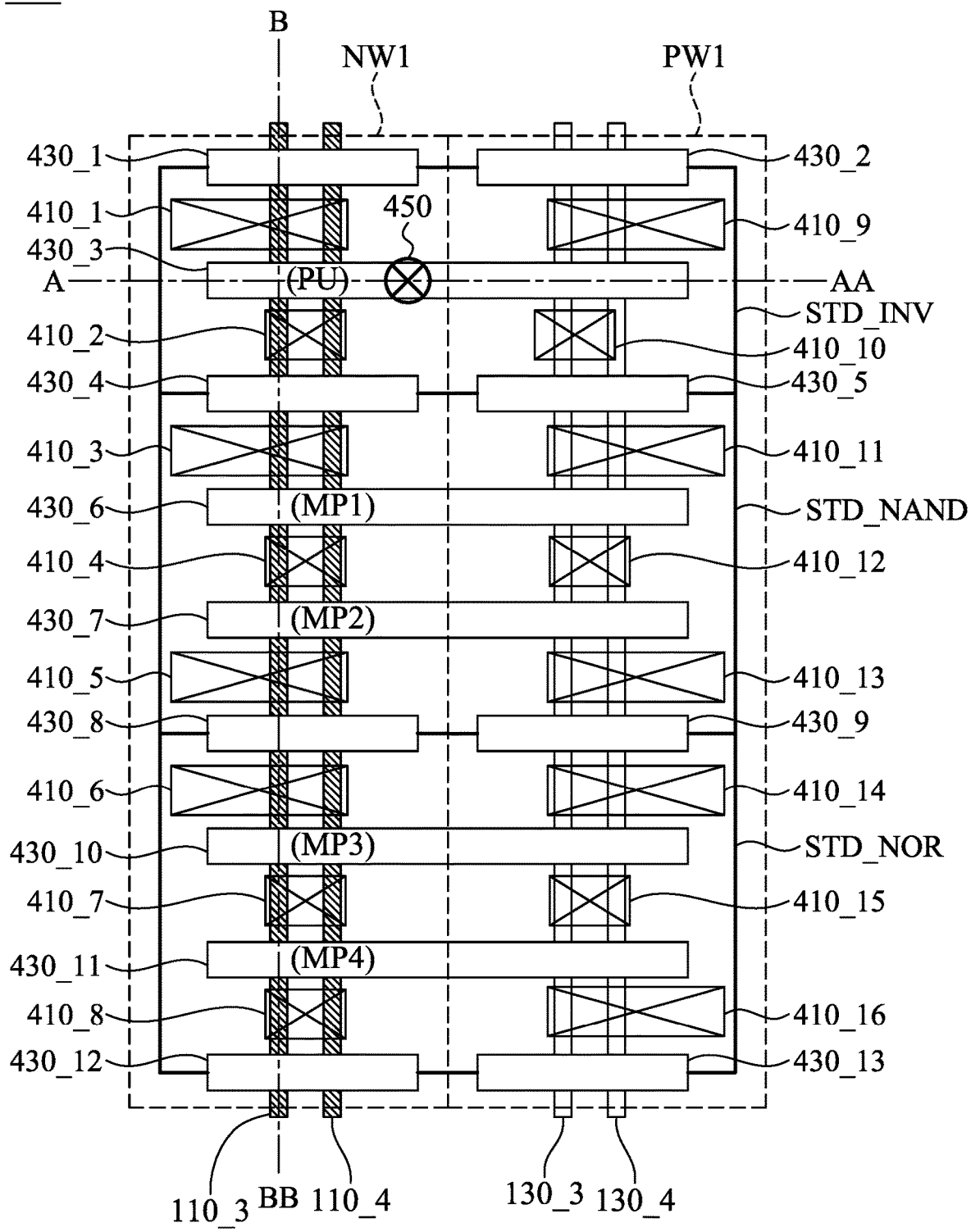
FIG. 4 shows the layout of the logic circuit 10C of FIG. 2, in accordance with some embodiments of the disclosure.

FIG. 4 shows the layout of the logic circuit 10C of FIG. 2, in accordance with some embodiments of the disclosure.

In some embodiments, the length of the semiconductor fins 110_3 and 110_4 is arranged across at least three standard cells STD_INV, STD_NAND, and STD_NOR. Furthermore, the standard cells STD_INV, STD_NAND, and STD_NOR abut one another.

Referring to FIG. 4 and FIG. 3A together, in the standard cell STD_INV, the P-type FinFET PU is formed in the N-type well region NW1 of a substrate, and the N-type FinFET PD is formed in the P-type well region PW1 of the substrate. The semiconductor fins 110_3 and 110_4 are configured to serve as the channel region of the P-type FinFET PU. For the P-type FinFET PU, an electrode 430_3 is configured to electrically connect a gate structure corresponding to a gate region of the P-type FinFET PU, and the electrode 430_3 is also configured to electrically couple to a signal line for receiving the input signal IN through the interconnect structure (not shown) in the logic circuit 10C. In some embodiments, the interconnect structure is formed by multiple metals and multiple vias on the standard cell STD_INV.

In the standard cell STD_INV, the contacts 410_1 and 410_2 are configured to electrically connect the source region (e.g., node 310 of FIG. 3A) and the drain region (e.g., node 312 of FIG. 3A) of the P-type FinFET PU, respectively. Similarly, the contact 410_1 is configured to electrically couple to a power line VDD through the interconnect structure (not shown) in the logic circuit 10C, and contact 410_2 is configured to electrically couple to a signal line for providing the output signal OUT through the interconnect structure (not shown) in the logic circuit 10C.

In some embodiments, the electrodes 430_1-430_13 of FIG. 4 are the gate electrode made of a conductive material, such as aluminum (Al), copper (Cu), tungsten (W), titanium (Ti), tantalum (Ta), or another applicable material. In some embodiments, the gate electrode includes a structure selected from a group consisting of poly gate/SiON structure, metals/high-K dielectric structure, Al/refractory metals/high-K dielectric structure, silicide/high-K dielectric structure, or combination.

In the standard cell STD_INV, the semiconductor fins 130_3 and 130_4 are configured to serve as the channel region of the N-type FinFET PD. For the N-type FinFET PD, the electrode 430_3 is configured to electrically connect a gate structure corresponding to a gate region of the N-type FinFET PD, and the electrode 430_3 is also coupled to the gate region of the P-type FinFET PU. The contacts 410_9 and 410_10 are configured to electrically connect the source region (e.g. node 316 of FIG. 3A) and drain region (e.g. node 314 of FIG. 3A) of the N-type FinFET PD, respectively. Similarly, the contact 410_9 is configured to electrically couple to a ground line VSS through the interconnect structure (not shown) in the logic circuit 10C. Furthermore, the contact 410_10 is configured to electrically couple to the signal line for providing the output signal OUT and the drain region of the P-type FinFET PU (e.g., contact 410_2) through the interconnect structure (not shown) in the logic circuit 10C.

Referring to FIG. 4 and FIG. 3B together, in the standard cell STD_NAND, the P-type FinFETs MP1 and MP2 are formed in the N-type well region NW1, and the N-type FinFETs MN1 and MN2 are formed in the P-type well region PW1. The semiconductor fins 110_3 and 110_4 are configured to serve as the channel regions of the P-type FinFETs MP1 and MP2. For the P-type FinFET MP1, an electrode 430_6 is configured to electrically connect a gate structure corresponding to a gate region of the P-type FinFET MP1, and the electrode 430_6 is also configured to electrically couple to a signal line for receiving the input signal IN1 through the interconnect structure (not shown) in the logic circuit 10C. The contacts 410_3 and 410_4 are configured to electrically connect the source region (e.g., node 330 of FIG. 3B) and the drain region (e.g., node 334 of FIG. 3B) of the P-type FinFET MP1, respectively.

For the P-type FinFET MP2 of the standard cell STD_NAND, an electrode 430_7 is configured to electrically connect a gate structure corresponding to a gate region of the P-type FinFET MP2, and the electrode 430_7 is also configured to electrically couple to a signal line for receiving the input signal IN2 through the interconnect structure (not shown) in the logic circuit 10C. The contacts 410_5 and 410_4 are configured to electrically connect the source region (e.g., node 332 of FIG. 3B) and the drain region (e.g., node 334 of FIG. 3B) of the P-type FinFET MP2, respectively. Furthermore, the contacts 410_3 and 410_5 are configured to electrically couple to a power line VDD through the interconnect structure (not shown) in the logic circuit 10C, and contact 410_4 is configured to electrically couple to a signal line for providing the output signal OUT through the interconnect structure (not shown) in the logic circuit 10C.

In the standard cell STD_NAND, the semiconductor fins 130_3 and 130_4 are configured to serve as the channel region of the N-type FinFETs MN1 and MN2. For the N-type FinFET MN1 of the standard cell STD_NAND, the electrode 430_6 is configured to electrically connect a gate structure corresponding to a gate region of the N-type FinFET MN1, and the electrode 430_6 is also coupled to the gate region of the P-type FinFET MP1. The contacts 410_11 and 410_12 are configured to electrically connect the drain region (e.g. node 336 of FIG. 3B) and the source region (e.g. node 338 of FIG. 3B) of the N-type FinFET MN1, respectively. Furthermore, the contact 410_11 is also configured to electrically couple to the signal line for providing the output signal OUT and the drain region of the P-type FinFETs MP1 and MP2 (e.g., contact 410_4) through the interconnect structure (not shown) in the logic circuit 10C. The contact 410_12 is also configured to electrically couple to the drain region of the N-type FinFET MN2.

For the N-type FinFET MN2 of the standard cell STD_NAND, the electrode 430_7 is configured to electrically connect a gate structure corresponding to a gate region of the N-type FinFET MN2, and the electrode 430_7 is also coupled to the gate region of the P-type FinFET MP2. The contacts 410_12 and 410_13 are configured to electrically connect the drain region (e.g. node 338 of FIG. 3B) and the source region (e.g. node 340 of FIG. 3B) of the N-type FinFET MN1, respectively.

Referring to FIG. 4 and FIG. 3C together, in the standard cell STD_NOR, the P-type FinFETs MP3 and MP4 are formed in the N-type well region NW1, and the N-type FinFETs MN3 and MN4 are formed in the P-type well region PW1. The semiconductor fins 110_3 and 110_4 are configured to serve as the channel region of the P-type FinFETs MP3 and MP4. For the P-type FinFET MP3, an electrode 430_10 is configured to electrically connect a gate structure corresponding to a gate region of the P-type FinFET MP3, and the electrode 430_10 is also configured to electrically couple to a signal line for receiving the input signal IN1 through the interconnect structure (not shown) in the logic circuit 10C. The contacts 410_6 and 410_7 are configured to electrically connect the source region (e.g., node 350 of FIG. 3C) and the drain region (e.g., node 352 of FIG. 3C) of the P-type FinFET MP3, respectively. Furthermore, the contact 410_6 is configured to electrically couple to a power line VDD through the interconnect structure (not shown) in the logic circuit 10C.

For the P-type FinFET MP4 of the standard cell STD_NOR, an electrode 430_11 is configured to electrically connect a gate structure corresponding to a gate region of the P-type FinFET MP4, and the electrode 430_11 is also configured to electrically couple to a signal line for receiving the input signal IN2 through the interconnect structure (not shown) in the logic circuit 10C. The contacts 410_7 and 410_8 are configured to electrically connect the source region (e.g., node 352 of FIG. 3C) and the drain region (e.g., node 354 of FIG. 3C) of the P-type FinFET MP4, respectively. The contact 410_8 is configured to electrically couple to a signal line for providing the output signal OUT through the interconnect structure (not shown) in the logic circuit 10C.

In the standard cell STD_NOR, the semiconductor fins 130_3 and 130_4 are configured to serve as the channel region of the N-type FinFETs MN3 and MN4. For the N-type FinFET MN3, the electrode 430_10 is configured to electrically connect a gate structure corresponding to a gate region of the N-type FinFET MN3, and the electrode 430_10 is also coupled to the gate region of the P-type FinFET MP3. The contacts 410_14 and 410_15 are configured to electrically connect the source region (e.g. node 360 of FIG. 3C) and drain region (e.g. node 356 of FIG. 3C) of the N-type FinFET MN3, respectively. Furthermore, the contact 410_15 is also configured to electrically couple to the signal line for providing the output signal OUT and the drain region (e.g., contact 410_8) of the P-type FinFET MP3 through the interconnect structure (not shown) in the logic circuit 10C. The contacts 410_14 and 410_16 are configured to electrically couple to a ground line VSS through the interconnect structure (not shown) in the logic circuit 10C.

In FIG. 4, the isolation FinFETs are formed between the boundaries of the standard cells. For example, an electrode 430_4 is configured to electrically connect a gate structure corresponding to a gate region of an isolation P-type FinFET in the boundary of the standard cells STD_INV and STD_NAND, and the contacts 410_3 and 410_2 are configured to electrically connect the source and drain regions of the isolation P-type FinFET. Furthermore, an electrode 430_5 is configured to electrically connect a gate structure corresponding to a gate region of an isolation N-type FinFET in the boundary of the standard cells STD_INV and STD_NAND, and the contacts 410_11 and 410_10 are configured to electrically connect the source and drain regions of the isolation N-type FinFET. Similarly, the electrode 430_1, 430_8 and 430_12 are configured to electrically connect the gate structures corresponding to the gate regions of the isolation P-type FinFETs, and the electrode 430_2, 430_9 and 430_13 are configured to electrically connect the gate structures corresponding to the gate regions of the isolation N-type FinFETs.

Figure 5:
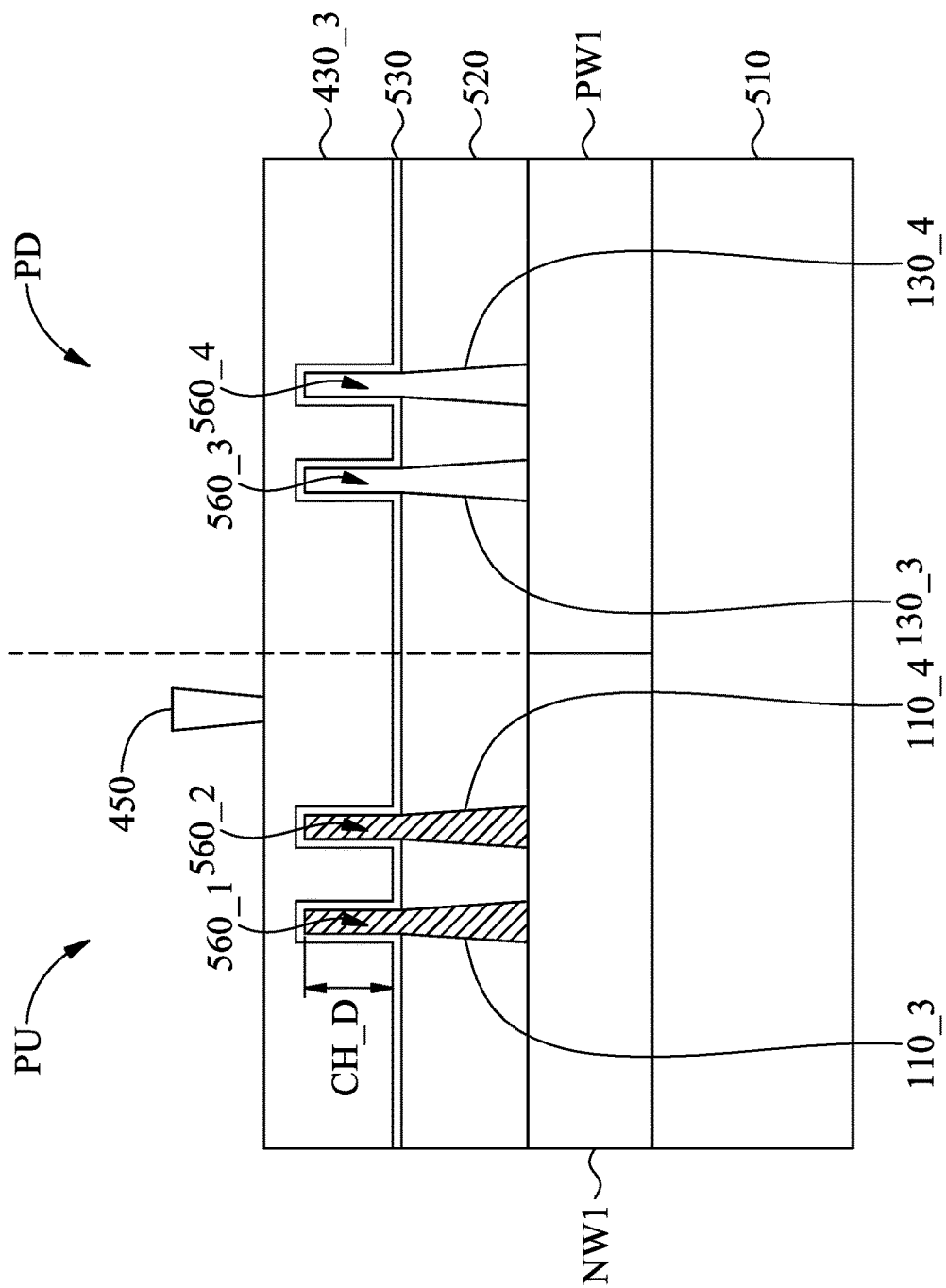
FIG. 5 is a schematic diagram cross-sectional view taken along line A-AA of FIG. 4, illustrating a cross-sectional view of the standard cell STD_INV of the digital circuit 10C.

FIG. 5 is a schematic diagram cross-sectional view taken along line A-AA of FIG. 4, illustrating a cross-sectional view of the standard cell STD_INV of the digital circuit 10C. The P-type well PW1 and the N-type well region NW1 are formed on a substrate 510. In some embodiments, the substrate 510 is a Si substrate. The semiconductor fins 110_3 and 110_4 are formed on the N-type well region NW1, and the semiconductor fins 130_3 and 130_4 are formed on the P-type well PW1. The semiconductor fins 110_3 and 110_4 are formed of SiGe material, and the semiconductor fins 110_3 and 110_4 are configured to serve as the channel regions 560_1 and 560_2 of the P-type FinFET PU. The semiconductor fins 130_3 and 140_4 are formed of Si-base (non-SiGe) material, and the semiconductor fins 130_3 and 130_4 are configured to serve as the channel regions 560_3 and 560_4 of the N-type FinFET PD. Furthermore, the semiconductor fins 1103 and 1104 and the semiconductor fins 130_3 and 130_4 are separated from each other by the shallow trench isolation (STI) 520.

In FIG. 5, a gate dielectric layer 530 and the electrode 430_3 (e.g., gate electrode) formed over the gate dielectric layer 530, are positioned over sidewalls and a top surface of the semiconductor fins 110_3, 110_4, 130_3 and 130_4. In some embodiments, the channel region of P-type FinFET PU includes a SiGe channel region. In addition, the Ge atomic concentration in the SiGe channel region is in a range from about 10% to about 40%. In some embodiments, the gate dielectric layer 530 is a high dielectric constant (high-k) dielectric material. A high-k dielectric material has a dielectric constant (k) higher than that of silicon dioxide. Examples of high-k dielectric materials include hafnium oxide, zirconium oxide, aluminum oxide, silicon oxynitride, hafnium dioxide-alumina alloy, hafnium silicon oxide, hafnium silicon oxynitride, hafnium tantalum oxide, hafnium titanium oxide, hafnium zirconium oxide, another suitable high-k material, or a combination thereof. In some embodiments, the electrode 430_3 is made of a conductive material, such as aluminum (Al), copper (Cu), tungsten (W), titanium (Ti), tantalum (Ta), or another applicable material. In some embodiments, the electrode 430_3 includes multiple material structure selected from a group consisting of poly gate/SiON structure, metals/high-K dielectric structure, Al/refractory metals/high-K dielectric structure, silicide/high-K dielectric structure, or combination.

In some embodiments, the sidewall depth CH_D of the SiGe channel region of the P-type FinFETs of the standard cells of logic circuit 10C is in a range from about 35 nm to about 90 nm.

In some embodiments, the source and drain regions of the N-type FinFETs of the standard cells of logic circuit 10C include material selected from a group consisting of silicon carbide (SiC), silicon phosphorous (SiP), phosphorous-doped silicon carbon (SiCP), silicon arsenides (SiAs), silicon (Si), or a combination thereof.

Figure 6:
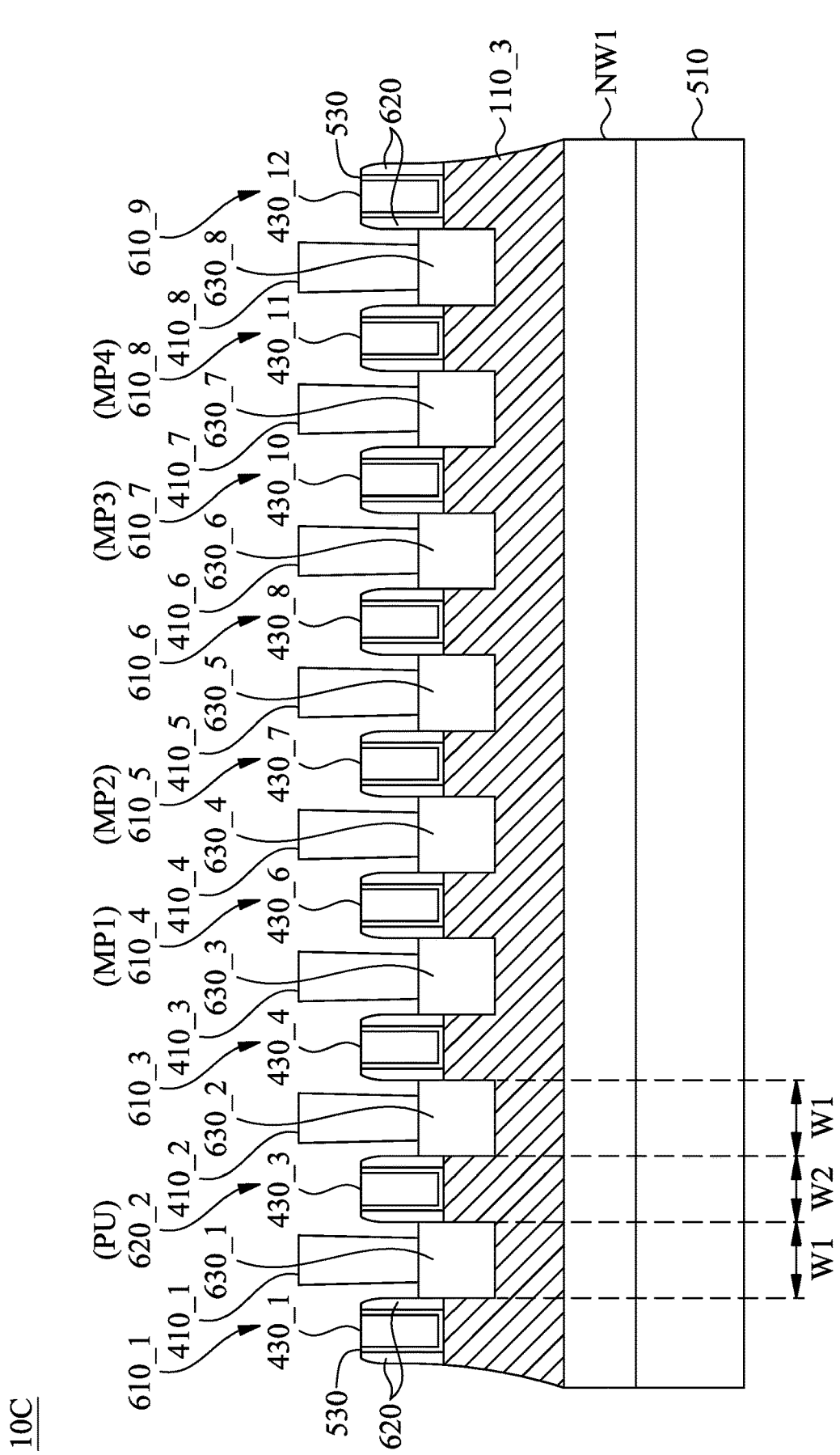
FIG. 6 is a schematic diagram cross-sectional view taken along line B-BB of FIG. 4, illustrating a cross-sectional view of the P-type FinFETs of the digital circuit 10C, in accordance with some embodiments of the disclosure.

FIG. 6 is a schematic diagram cross-sectional view taken along line B-BB of FIG. 4, illustrating a cross-sectional view of the P-type FinFETs PU and MP1-MP4 of the digital circuit 10C, in accordance with some embodiments of the disclosure.

The N-type well region NW1 is formed on the substrate 510. The semiconductor fin 110_3 is formed on the N-type well region NW1. Multiple gate structures 610_1-610_9 are positioned on the semiconductor fin 110_3. Each of the gate structures 610_1-610_9 may include a gate dielectric layer 530 and a gate electrode (e.g., 430_1-430_12). Gate spacers 620 may be formed on opposite sidewalls of the gate structures and over the semiconductor fin 110_3. In addition, source/drain features 630_1-630_8 may be formed in a doping layer on outer sidewalls of the gate spacers 620 of the two adjacent gate structures. For example, the source/drain feature 630_4 is formed between the gate spacer 620 on the right side of the gate structure 610_4 and the gate spacer 620 on the left side of the gate structure 610_5. Specifically, each of the source/drain features 630_1-630_8 is extending from the channel regions of the P-type FinFETs. In some embodiments, a silicide layer is formed upon the source/drain features 630_1-630_8.

The source/drain features 630_1-630_8 are configured to serve as the source/drain regions of the P-type FinFETs in the fin structure 110_3. The source/drain features 630_1-630_8 are formed by etching the LDD regions (not shown) within the fin structure 110_3 to form recesses (not shown), and epitaxially growing a material in the recesses, using suitable methods such as metal-organic CVD (MOCVD), molecular beam epitaxy (MBE), liquid phase epitaxy (LPE), vapor phase epitaxy (VPE), selective epitaxial growth (SEG), the like, or a combination thereof. In some embodiments, the source/drain features 630_1-630_8 include silicon germanium (SiGe), and a p-type impurity such as boron (e.g. B11) or indium.

In some embodiments, the Ge atomic concentration in source/drain features 630_1-630_8 is in a range from about 30% to about 75%. Furthermore, the Ge atomic concentration in the source/drain features 630_1-630_8 is higher than the Ge atomic concentration in the channel regions of the P-type FinFETs PU and MP1-MP4.

For the standard cell STD_INV, the gate structure 610_2 is configured to serve as the gate region of the P-type FinFET PU, and the source/drain features 630_1 and 630_2 are formed in the source and drain regions of the P-type FinFET PU.

For the standard cell STD_NAND, the gate structure 610_4 is configured to serve as the gate region of the P-type FinFET MP1, and the source/drain features 630_3 and 630_4 are formed in the source and drain regions of the P-type FinFET MP1. The gate structure 610_5 is configured to serve as the gate region of the P-type FinFET MP2, and the source/drain features 630_5 and 630_4 are formed in the source and drain regions of the P-type FinFET MP2.

For the standard cell STD_NOR, the gate structure 610_7 is configured to serve as the gate region of the P-type FinFET MP3, and the source/drain features 630_6 and 630_7 are formed in the source and drain regions of the P-type FinFET MP3. The gate structure 610_8 is configured to serve as the gate region of the P-type FinFET MP4, and the source/drain features 630_7 and 630_8 are formed in the source and drain regions of the P-type FinFET MP4.

In some embodiments, for each P-type FinFET, the width of the source/drain features 630_1-630_8 is greater than the width of the channel region under the gate structure of the P-type FinFET. Taking the P-type FinFET PU of the standard cell STD_INV as an example, the width of the source/drain features 630_1 and 630_2 is W1, and the channel region of the gate structure of the P-type FinFET PU have a width W2 less than W1 (i.e., W2<W1). In some embodiments, the width W2 of the channel region of the gate structure of the P-type FinFET PU is within a range from 3 nm to 10 nm.

Recent advances in FinFET transistor technology have made advanced SRAM cells using FinFET transistors possible. In contrast to the planar MOS transistor, which has a channel formed at the surface of a semiconductor substrate, a FinFET has a three dimensional channel region. The three-dimensional shape of the FinFET channel region allows for an increased gate width without increased silicon area, even as the overall scale of the devices is reduced with semiconductor process scaling and in conjunction with a reduced gate length, and provide a reasonable channel width characteristic at a low silicon area cost.

When an SRAM cell is formed using single fin finFET transistor for the pull up or "PU" transistor, the "alpha ratio" of the on current ("Ion") for the P-type transistors, that is the ratio PU_Ion/PG_Ion, is negatively impacted. The SRAM cells formed of these transistors may therefore exhibit a poor write margin metric, and the amount that the cell positive supply voltage Vcc can be lowered ("Vcc_min") while maintaining proper operation will be reduced. A reduced Vcc_min metric negatively impacts the power consumption for an integrated circuit using the SRAM cells. In the known approaches, solutions such as threshold voltage ("Vt") tuning and gate length skew adjustments of certain ones of the FinFET devices are used to increase performance of the SRAM cells.

To have lower alpha ratio (Ion_PU/Ion_PG) to gain the cell write margin and without impact the chip speed or induced extra cost is important. SRAM and low leakage devices usually prefer higher Vt setting for low standby leakage requirements.

Figure 7:
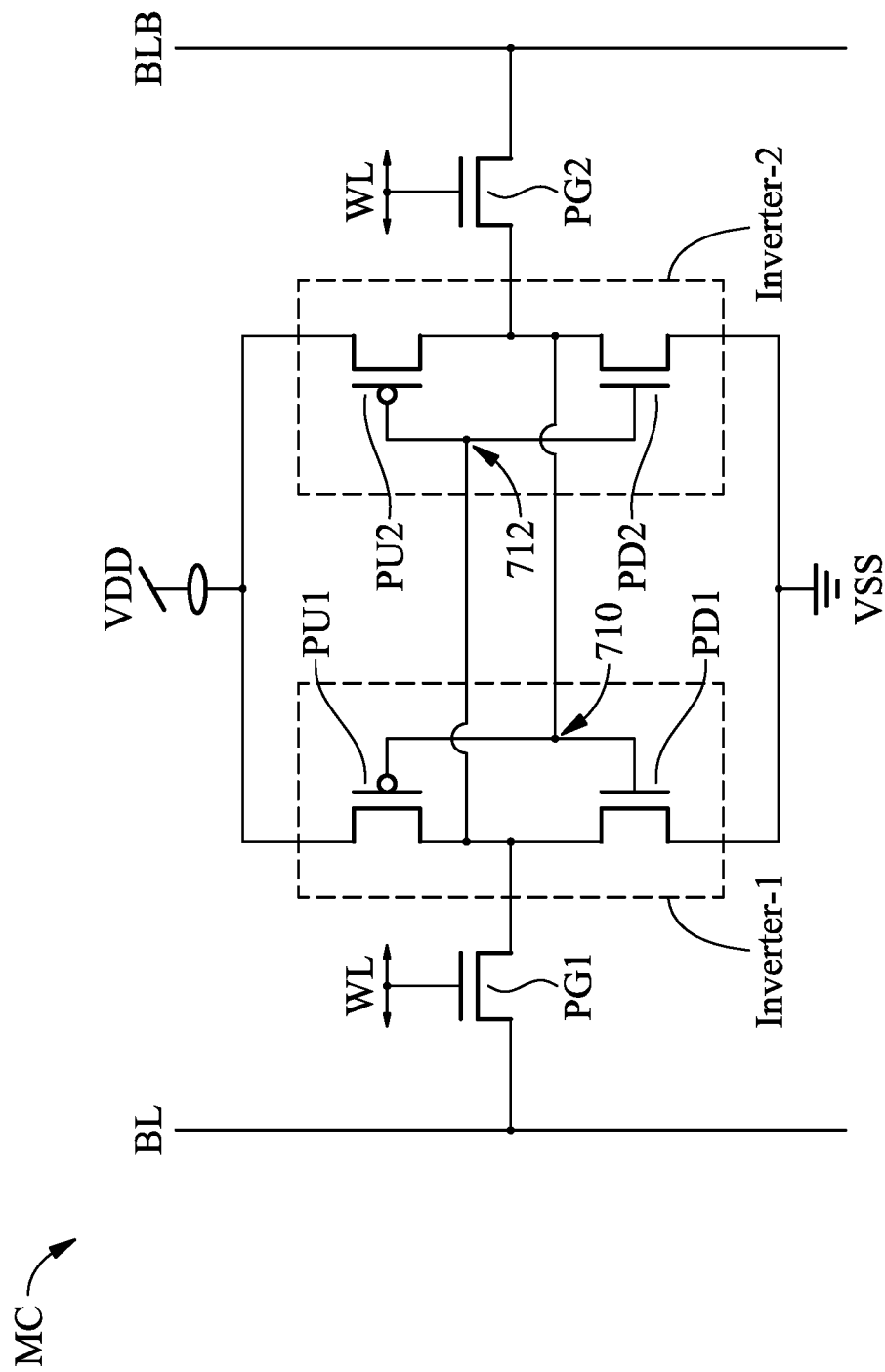
FIG. 7 is a simplified diagram of a SRAM cell MC, in accordance with some embodiments of the disclosure.

FIG. 7 is a simplified diagram of a SRAM cell MC (e.g., MC1-MC10 of FIGS. 1A and 1B), in accordance with some embodiments of the disclosure. The SRAM cell MC includes a pair of cross-coupled inverters Inverter-1 and Inverter-2, and two pass-gate transistors PG1 and PG2. The inverters Inverter-1 and Inverter-2 are cross-coupled between the nodes 712 and 710, and form a latch. The pass-gate transistor PG1 is coupled between a bit line BL and the node 712, and the pass-gate transistor PG2 is coupled between a complementary bit line BLB and the node 710, wherein the complementary bit line BLB is complementary to the bit line BL. The gates of the pass-gate transistors PG1 and PG2 are coupled to the same word-line WL. Furthermore, the pass-gate transistors PG1 and PG2 are N-type FinFETs.

The inverter Inverter-1 includes a pull-up transistor PU1 and a pull-down transistor PD1. The pull-up transistor PU1 is a P-type FinFET, and the pull-down transistor PD1 is an N-type FinFET. The drain of the pull-up transistor PU1 and the drain of the pull-down transistor PD1 are coupled to the node 712 connecting the pass-gate transistor PG1. The gates of the pull-up transistor PU1 and the pull-down transistor PD1 are coupled to the node 710 connecting the pass-gate transistor PG2. Furthermore, the source of the pull-up transistor PU1 is coupled to a power line VDD, and the source of the pull-down transistor PD1 is coupled to a ground line VSS.

Similarly, the inverter Inverter-2 includes a pull-up transistor PU2 and a pull-down transistor PD2. The pull-up transistor PU2 is a P-type FinFET, and the pull-down transistor PD2 is an N-type FinFET. The drains of the pull-up transistor PU2 and the pull-down transistor PD2 are coupled to the node 710 connecting the pass-gate transistor PG2. The gates of the pull-up transistor PU2 and the pull-down transistor PD2 are coupled to the node 712 connecting the pass gate transistor PG1. Furthermore, the source of the pull-up transistor PU2 is coupled to the power line VDD, and the source of the pull-down transistor PD2 is coupled to the ground line VSS.

Figure 8:
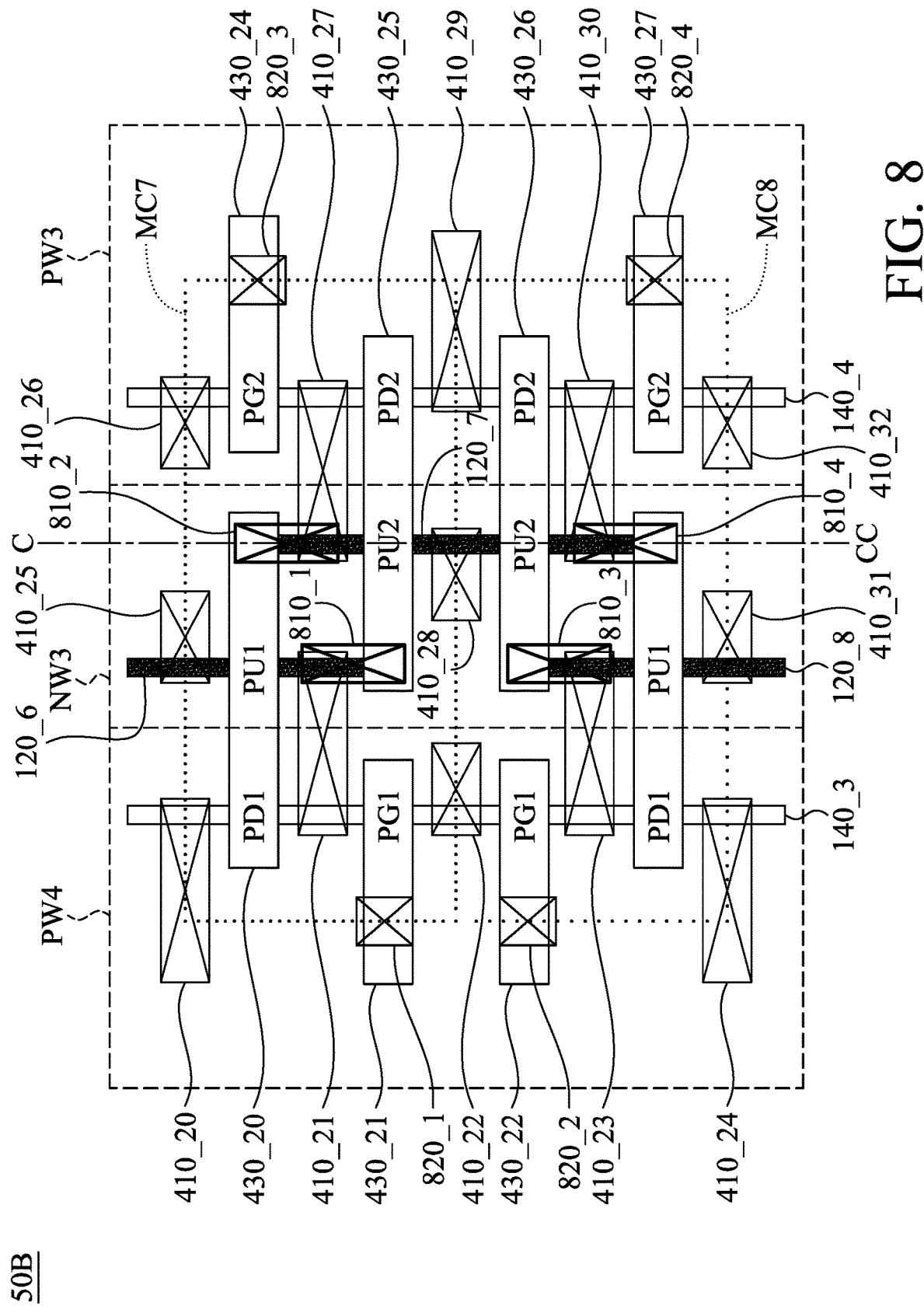
FIG. 8 shows the layout of the SRAM cells MC7 and MC8 of the SRAM of FIG. 1B, in accordance with some embodiments of the disclosure.

FIG. 8 shows the layout of the SRAM cells MC7 and MC8 of the SRAM 50B of FIG. 1B, in accordance with some embodiments of the disclosure. The two adjacent SRAM cells MC7 and MC8 are arranged in the same column of the cell array of the SRAM 50B. In some embodiments, the two adjacent SRAM cells MC7 and MC8 are arranged in mirror symmetry. A interconnect structure of the two adjacent SRAM cells MC7 and MC8 will be described in detail below. It should be noted that various levels of the interconnect structure shown in FIG. 8 is merely an example and is not intended to limit the SRAM cells MC of the SRAM.

In the SRAM cell MC8 of FIG. 8, the semiconductor fin 140_3 is configured to serve as the channel regions of the pass-gate transistor PG1 and the pull-down transistor PD1. Furthermore, the pass-gate transistor PG1 and the pull-down transistor PD1 are formed in the P-type well region PW4. For the pass-gate transistor PG1, an electrode 430_22 is configured to electrically connect a gate structure corresponding to a gate region of the pass-gate transistor PG1, and the contacts 410-23 and 410-22 are configured to electrically connect the drain and source regions of the pass-gate transistor PG1, respectively. For the pull-down transistor PD1, an electrode 430_23 is configured to electrically connect a gate structure corresponding to a gate region of the pull-down transistor PD1, and the contacts 410_23 and 410_24 are configured to electrically connect the drain and source regions of the pull-down transistor PD1, respectively.

In the SRAM cell MC8 of FIG. 8, the semiconductor fin 120_8 is configured to serve as the channel region of the pull-up transistor PU1. Furthermore, the pull-up transistor PU1 is formed in the N-type well region NW3. For the pull-up transistor PU1, the electrode 430_23 is configured to electrically connect a gate structure corresponding to a gate region of the pull-up transistor PU1, and the contact 410_23 and 410_31 are configured to electrically connect the drain and source regions of the pull-up transistor PU1, respectively. As described above, the electrode 430_23 is also electrically coupled to the gate region of the pull-down transistor PD1, and the contact 410_23 is also electrically coupled to the drain regions of the pull-down transistor PD1 and the pass-gate transistor PG1.

In the SRAM cell MC8 of FIG. 8, the semiconductor fin 120_7 is configured to serve as the channel region of the pull-up transistor PU2. Furthermore, the pull-up transistor PU2 is formed in the N-type well region NW3. For the pull-up transistor PU2, the electrode 430_26 is configured to electrically connect a gate structure corresponding to a gate region of the pull-up transistor PU2, and the contact 410_30 and 410_28 are configured to electrically connect the drain and source regions of the pull-up transistor PU2, respectively. Furthermore, the electrode 430_26 is configured to electrically connect the contact 410_23 through a gate contact 810_3, thus the gate region of the pull-up transistor PU2 is electrically coupled to the drain regions of the pull-up transistor PU1, the pull-down transistor PD1, and the pass-gate transistor PG1.

In the SRAM cell MC8 of FIG. 8, the semiconductor fin 140_4 is configured to serve as the channel regions of the pass-gate transistor PG2 and the pull-down transistor PD2. Furthermore, the pass-gate transistor PG2 and the pull-down transistor PD2 are formed in the P-type well region PW3. In some embodiments, the N-type well region NW3 is positioned between the P-type well regions PW3 and PW4. For the pass-gate transistor PG2, an electrode 430_27 is configured to electrically connect a gate structure corresponding to a gate region of the pass-gate transistor PG2, and the contacts 410_30 and 410_32 are configured to electrically connect the drain and source regions of the pass-gate transistor PG2, respectively. For the pull-down transistor PD2, the electrode 430_26 is configured to electrically connect a gate structure corresponding to a gate region of the pull-down transistor PD2, and the contacts 410_30 and 410_29 are configured to electrically connect the drain and source regions of the pull-down transistor PD2, respectively. As described above, the electrode 430_26 is also electrically coupled to the gate region of the pull-up transistor PU2, thus the gate region of the pull-down transistor PD2 is also electrically coupled to the drain regions of the pull-up transistor PU1, the pull-down transistor PD1, and the pass-gate transistor PG1. Moreover, the contact 410_30 is electrically coupled to the drain region of the pull-up transistor PU2 and to the electrode 430_23 through the gate contact 810_4, thus the drain regions of the pull-down transistor PD2 and the pass-gate transistor PG2 are also electrically coupled to the drain region of the pull-up transistor PU2, and the gate regions of the pull-up transistor PU1 and the pull-down transistor PD1.

For the SRAM cells MC7 and MC8, the N-type well region NW3 is arranged in the middle of the SRAM cells MC7 and MC8, and the P-type well regions PW3 and PW4 are arranged on opposite sides of the N-type well region NW3.

In the SRAM cell MC7 of FIG. 8, the semiconductor fin 140_3 is also configured to serve as the channel regions of the pass-gate transistor PG1 and the pull-down transistor PD1. Furthermore, the pass-gate transistor PG1 and the pull-down transistor PD1 are formed in the P-type well region PW4. For the pass-gate transistor PG1, an electrode 430_21 is configured to electrically connect a gate structure corresponding to a gate region of the pass-gate transistor PG1, and the contacts 410-21 and 410-22 are configured to electrically connect the drain and source regions of the pass-gate transistor PG1, respectively. For the pull-down transistor PD1, an electrode 430_20 is configured to electrically connect a gate structure corresponding to a gate region of the pull-down transistor PD1, and the contacts 410_21 and 410_20 are configured to electrically connect the drain and source regions of the pull-down transistor PD1, respectively.

For the SRAM cells arranged in the same column, the semiconductor fin 140_3 is shared by the pass-gate transistor PG1 and the pull-down transistor PD1 of the SRAM cells, and the semiconductor fin 140_3 is configured to serve as the channel regions of the pass-gate transistor PG1 and the pull-down transistor PD1 of the SRAM cells arranged in the same column. As described above, the semiconductor fin 140_3 is continuous fin including with Si.

In the SRAM cell MC7 of FIG. 8, the semiconductor fin 120_6 is configured to serve as the channel region of the pull-up transistor PU1. Furthermore, the pull-up transistor PU1 is formed in the N-type well region NW3. For the pull-up transistor PU1, the electrode 430_20 is configured to electrically connect a gate structure corresponding to a gate region of the pull-up transistor PU1, and the contact 410_21 and 410_25 are configured to electrically connect the drain and source regions of the pull-up transistor PU1, respectively. As described above, the electrode 430_20 is also electrically coupled to the gate region of the pull-down transistor PD1, and the contact 410_21 is also electrically coupled to the drain regions of the pull-down transistor PD1 and the pass-gate transistor PG1.

In the SRAM cell MC7 of FIG. 8, the semiconductor fin 120_7 is also configured to serve as the channel region of the pull-up transistor PU2. Furthermore, the pull-up transistor PU2 is formed in the N-type well region NW3. For the pull-up transistor PU2, the electrode 430_25 is configured to electrically connect a gate structure corresponding to a gate region of the pull-up transistor PU2, and the contact 410_27 and 410_28 are configured to electrically connect the drain and source regions of the pull-up transistor PU2, respectively. Furthermore, the electrode 430_25 is configured to electrically connect the contact 410_27 through a gate contact 810_1, thus the gate region of the pull-up transistor PU2 is electrically coupled to the drain regions of the pull-up transistor PU1, the pull-down transistor PD1, and the pass-gate transistor PG1.

For the SRAM cells arranged in the same column, the pull-up transistors PU1 of the two adjacent SRAM cells share the same semiconductor fin, and the pull-up transistors PU2 of the two adjacent SRAM cells share the same semiconductor fin. As described above, the semiconductor fins 120_6, 120_7 and 120_8 are discontinuous fin lines including non-SiGe material.

In the SRAM cell MC7 of FIG. 8, the semiconductor fin 140_4 is also configured to serve as the channel regions of the pass-gate transistor PG2 and the pull-down transistor PD2. Furthermore, the pass-gate transistor PG2 and the pull-down transistor PD2 are formed in the P-type well region PW3. For the pass-gate transistor PG2, an electrode 430_24 is configured to electrically connect a gate structure corresponding to a gate region of the pass-gate transistor PG2, and the contacts 410_27 and 410_26 are configured to electrically connect the drain and source regions of the pass-gate transistor PG2, respectively. For the pull-down transistor PD2, the electrode 430_25 is configured to electrically connect a gate structure corresponding to a gate region of the pull-down transistor PD2, and the contacts 410_27 and 410_29 are configured to electrically connect the drain and source regions of the pull-down transistor PD2, respectively. As described above, the electrode 430_25 is also electrically coupled to the gate region of the pull-up transistor PU2, thus the gate region of the pull-down transistor PD2 is also electrically coupled to the drain regions of the pull-up transistor PU1, the pull-down transistor PD1, and the pass-gate transistor PG1. Moreover, the contact 410_27 is electrically coupled to the drain region of the pull-up transistor PU2 and to the electrode 430_20 through the gate contact 8102, thus the drain regions of the pull-down transistor PD2 and the pass-gate transistor PG2 are also electrically coupled to the drain region of the pull-up transistor PU2, and the gate regions of the pull-up transistor PU1 and the pull-down transistor PD1.

For the SRAM cells arranged in the same column, the semiconductor fin 140_4 are shared by the pass-gate transistor PG2 and the pull-down transistor PD2 of the SRAM cells, and the semiconductor fin 140_4 are configured to serve as the channel regions of the pass-gate transistor PG2 and the pull-down transistor PD2 of the SRAM cells arranged in the same column. As described above, the semiconductor fin 140_4 is continuous fin lines including Si.

For the SRAM cell MC7, the word line WL corresponding to the SRAM cell MC7 is coupled to the gate regions of the pass-gate transistors PG1 and PG2 through the gate contacts 820_1 and 8203, respectively. Similarly, for the SRAM cell MC8, the word line WL corresponding to the SRAM cell MC8 is coupled to the gate regions of the pass-gate transistors PG1 and PG2 through the gate contacts 820_2 and 820_4, respectively.

Figure 9:
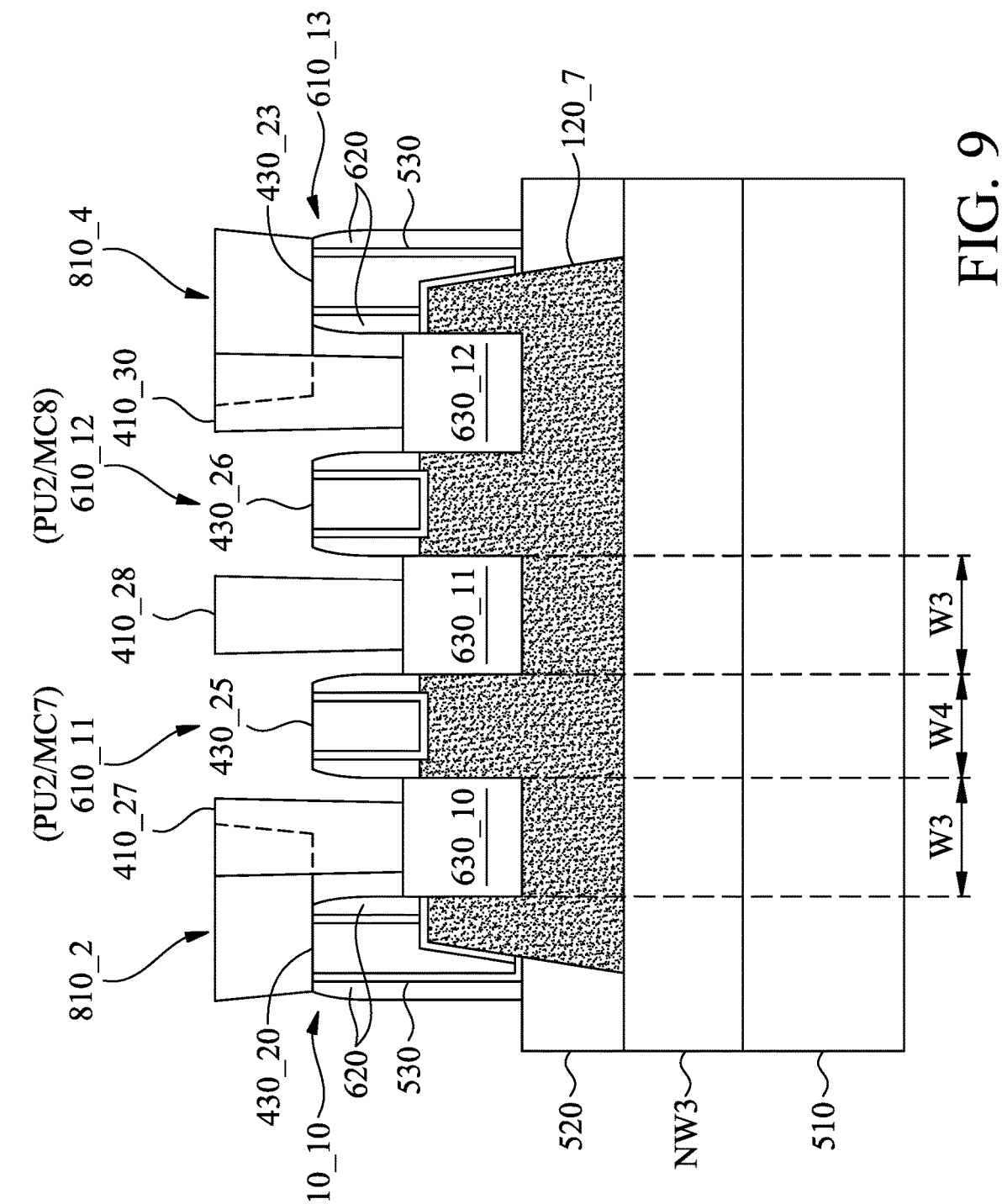
FIG. 9 is a schematic diagram cross-sectional view taken along line C-CC of FIG. 8, illustrating a cross-sectional view of the SRAM cells MC7 and MC8 of the SRAM, in accordance with some embodiments of the disclosure.

FIG. 9 is a schematic diagram cross-sectional view taken along line C-CC of FIG. 8, illustrating a cross-sectional view of the SRAM cells MC7 and MC8 of the SRAM 50B, in accordance with some embodiments of the disclosure.

The N-type well region NW3 is formed on the substrate 510. The semiconductor fin 120_7 is formed on the N-type well region NW3. Multiple gate structures 610_10-610_13 are positioned on the semiconductor fin 120_7. Each of the gate structures 610_10-610_13 may include a gate dielectric layer 530 and a gate electrode (e.g., 430_20, 430_25, 430_26 and 430_23). Gate spacers 620 may be formed on opposite sidewalls of the gate structures. In addition, source/drain features 630_10-630_12 may be formed in a doping layer on outer sidewalls of the gate spacers 620 of the two adjacent gate structures. For example, the source/drain feature 630_11 is formed between the gate spacer 620 on the right side of the gate structure 610_11 and the gate spacer 620 on the left side of the gate structure 61012. Specifically, each of the source/drain features 630_10-630_12 is extending from the channel regions of the P-type FinFETs.

The source/drain features 630_10-630_12 are configured to serve as the source/drain regions of the pull-up transistors PU2 in the fin structure 120_7. The source/drain features 630_10-630_12 are formed by etching the LDD regions (not shown) within the fin structure 120_7 to form recesses (not shown), and epitaxially growing a material in the recesses, using suitable methods such as metal-organic CVD (MOCVD), molecular beam epitaxy (MBE), liquid phase epitaxy (LPE), vapor phase epitaxy (VPE), selective epitaxial growth (SEG), the like, or a combination thereof. In some embodiments, the source/drain features 630_10-630_12 include silicon germanium (SiGe), and a p-type impurity such as boron or indium. In some embodiments, the Ge atomic concentration in source/drain features 630_10-630_12 is in a range from about 30% to about 75%. Furthermore, the Ge atomic concentration in the source/drain features 630_10-630_12 is higher than the Ge atomic concentration in the channel regions of the pass-gate transistors PG2 and PG1. In some embodiments, a silicide layer is formed upon the source/drain features 630_10-630_12.

In some embodiments, a fin end of the semiconductor fin 120_7 is under the electrode 430_20, and another fin end of the semiconductor fin 120_7 is under the electrode 43023. Specifically, each semiconductor fin including non-SiGe material across the two adjacent SRAM cells in the N-type well. Furthermore, the semiconductor fin has discontinuous line shape, and the discontinuous ports of the semiconductor fin are closed to the drain regions of the pass-gate transistors PG1 and PG2.

For the SRAM cell MC_7, the gate structure 610_11 is configured to serve as the gate region of the pull-up transistors PU2, and the source/drain features 630_11 and 630_10 are formed in the source and drain regions of the pull-up transistors PU2.

For the SRAM cell MC_8, the gate structure 610_12 is configured to serve as the gate region of the pull-up transistors PU2, and the source/drain features 630_11 and 630_12 are formed in the source and drain regions of the pull-up transistors PU2.

In some embodiments, for each pull-up transistors PU1 and PU2 (i.e., P-type FinFETs of the SRAM cell), the width of the source/drain features is greater than the width of the channel region under the gate structure of the pull-up transistor PU1 or PU2. Taking the pull-up transistor PU2 of the SRAM cell MC7 as an example, the width of the source/drain features 630_10 and 630_11 is W3, and the channel region of the gate structure of the pull-up transistor PU2 have a width W4 less than W3 (i.e., W4<W3). In some embodiments, the width W4 of the channel region of the gate structure of the pull-up transistor PU1 or PU2 is within a range from 3 nm to 10 nm.

In an IC, the semiconductor fins including SiGe material are configured to serve as the channel regions of the P-type FinFETs within the standard cells, and the semiconductor fins including non-SiGe material (e.g., Si) are configured to serve as the channel regions of the P-type FinFETs (e.g., pull-up transistors PU1 and PU2) within the SRAM cells. In some embodiments, the channel width (e.g., W4 of FIG. 9) of the P-type FinFETs within the SRAM is narrow than the channel width (e.g., W2 of FIG. 6) of the P-type FinFETs within the logic circuit.

Embodiments of ICs including multiple standard cells and multiple SRAM cells are provided. The standard cells include the P-type FinFETs including SiGe channel formed by the continuous fin lines. Each continuous fin line is arranged across at least three standard cells abutted together. By using the continuous fin lines, line end shrink control of the semiconductor fins become easy and length of diffusion (LOD) effect is decreased for the P-type FinFETs within the standard cells. Furthermore, the SRAM cells include the P-type FinFETs including non-SiGe (e.g. Si) channel formed by the discontinuous fin lines. Each discontinuous fin line is arranged across the two adjacent SRAM cells. Therefore, high channel strain P-type FinFETs (e.g., Ion/Ioff>10% gain) of standard cells (e.g., speed driven logic circuit) and high threshold voltage (Vt) P-type FinFET PU device (that includes purely Si channel without extra channel strain layer) of SRAM cell are provided for write margin improvement as well as low standby requirements. Extra high threshold voltage FinFETs are provided for SRAM cell and lower leakage requirement devices. Therefore, the channel dopant concentration is decreased without considering mismatch and junction leakage. Furthermore, the source and drain regions of the P-type FinFETs of all the standard cells and the SRAM cells include SiGe content.

In some embodiments, an integrated circuit (IC) includes a standard cell array and a SRAM cell array. The standard cell array includes standard cells having first P-type transistors arranged in a first column of the standard cell array and a first fin structure shared by the first P-type transistors. The SRAM cell array includes SRAM cells having second P-type transistors arranged in a second column of the SRAM cell array and second fin structures arranged in the second column. Each of the second fin structures is shared by two adjacent second P-type transistors respectively disposed in two adjacent SRAM cells. A material of the first fin structure is different from a material of the second fin structures. A dimension of the first fin structure along the first column is greater than a dimension of each of the second fin structures along the second column.

In some embodiments, an integrated circuit (IC) includes a first cell array having standard cells and a second cell array having SRAM cells. The first cell array includes a first fin structure shared by first P-type transistors of the standard cells in the same first column of the first cell array and a second fin structure shared by first N-type transistors of the standard cells in the same first column. The second cell array includes a third fin structure shared by two adjacent second P-type transistors in two adjacent SRAM cells in the same second column of the second cell array and a fourth fin structure shared by second N-type transistors of the SRAM cells in the same second column. The second fin structure, the third fin structure, and the fourth fin structure have the same first material, and the first fin structure has a second material different from the first material. Lengths of the first fin structure, second fin structure, and fourth fin structure are longer than a length of the third fin structure.

In some embodiments, an integrated circuit (IC) includes P-type transistors and N-type transistors. The P-type transistors includes first P-type transistors in a first column of a logic cell (10C) array and sharing a first SiGe fin, and second P-type transistors in a second column of a SRAM cell array. Two adjacent second P-type transistors share a first non-SiGe fin. The N-type transistors includes first N-type transistors in the first column and sharing a second non-SiGe fin, and second N-type transistors in the second column and sharing a third non-SiGe fin. A channel width of the second P-type transistors is less than a channel width of the first P-type transistors.

The foregoing outlines nodes of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC), comprising:
    a standard cell array, comprising:
        standard cells having first P-type transistors arranged in a first column of the standard cell array; and
        a first fin structure shared by the first P-type transistors; and
    a SRAM cell array, comprising:
        SRAM cells having second P-type transistors arranged in a second column of the SRAM cell array; and
        second fin structures arranged in the second column, wherein each of the second fin structures is shared by two adjacent second P-type transistors respectively disposed in two adjacent SRAM cells,
    wherein a material of the first fin structure is different from a material of the second fin structures,
    wherein a dimension of the first fin structure along the first column is greater than a dimension of each of the second fin structures along the second column.

2. The IC as claimed in claim 1, wherein in the standard cells, source/drain features of the first P-type transistors in the first fin structure comprise silicon germanium (SiGe) and Boron, and a width of the source/drain features is wider than that of a channel region in the first P-type transistor.

3. The IC as claimed in claim 2, wherein in the standard cells, Ge atomic concentration in the channel region of the first P-type transistor is in a range from about 10% to about 40%.

4. The IC as claimed in claim 1, wherein in the SRAM cells, source/drain features of the second P-type transistors in the second fin structures comprise SiGe and Boron, and a width of the source/drain features is wider than that of a channel region of the second P-type transistor.

5. The IC as claimed in claim 1, wherein the first fin structure is a SiGe fin, and the second fin structures are Si fins.

6. The IC as claimed in claim 1, wherein the number of the first P-type transistors of the standard cells that share the first fin structure is greater than or equal to 3.

7. An integrated circuit (IC), comprising:
    a first cell array having standard cells, comprising:
        a first fin structure shared by first P-type transistors of the standard cells in the same first column of the first cell array; and
        a second fin structure shared by first N-type transistors of the standard cells in the same first column; and
    a second cell array having SRAM cells, comprising:
        a third fin structure shared by two adjacent second P-type transistors in two adjacent SRAM cells in the same second column of the second cell array; and
        a fourth fin structure shared by second N-type transistors of the SRAM cells in the same second column,
    wherein the second fin structure, the third fin structure, and the fourth fin structure have the same first material, and the first fin structure has a second material different from the first material,
    wherein lengths of the first fin structure, second fin structure, and fourth fin structure are longer than a length of the third fin structure.

8. The IC as claimed in claim 7, wherein the first P-type transistors of the standard cells comprise source/drain features doped with SiGe and Boron in the first fin structure, and a width of the source/drain features is wider than that of a channel region of the first P-type transistor.

9. The IC as claimed in claim 8, wherein Ge atomic concentration in the channel region of the first P-type transistor is in a range from about 10% to about 40%.

10. The IC as claimed in claim 7, wherein the second P-type transistors of the SRAM cells comprise source/drain features doped with SiGe and Boron in the third fin structure, and a width of the source/drain features is wider than that of a channel region of the second P-type transistor.

11. The IC as claimed in claim 7, wherein source/drain features of the first P-type transistors and the second P-type transistors comprise Ge atomic concentration in a range from about 30% to about 75%.

12. The IC as claimed in claim 7, wherein the standard cells in the same first column comprise inverter, NAND, NOR, Flip-Flop or latch.

13. An integrated circuit (IC), comprising:
P-type transistors, comprising:
first P-type transistors in a first column of a logic cell (10C) array and sharing a first SiGe fin; and
second P-type transistors in a second column of a SRAM cell array, wherein two adjacent second P-type transistors share a first non-SiGe fin; and
N-type transistors, comprising:
first N-type transistors in the first column and sharing a second non-SiGe fin; and
second N-type transistors in the second column and sharing a third non-SiGe fin,
wherein a channel width of the second P-type transistors is less than a channel width of the first P-type transistors.

14. The IC as claimed in claim 13, wherein the first P-type transistors comprise a sidewall depth of channel regions in the first SiGe fin with a range from about 35 nm to about 90 nm.

15. The IC as claimed in claim 13, wherein the first P-type transistors comprise source/drain features doped with SiGe and Boron in the first SiGe fin, and a width of the source/drain features is wider than that of channel regions of the first P-type transistors.

16. The IC as claimed in claim 15, wherein Ge atomic concentration in the channel regions of the first P-type transistor is in a range from about 10% to about 40% and is less than Ge atomic concentration in the source/drain features of the first P-type transistor.

17. The IC as claimed in claim 13, wherein the second P-type transistors comprise source/drain features doped with SiGe and Boron in the first non-SiGe fin, and a width of the doping layer is wider than that of channel regions of the second P-type transistors.

18. The IC as claimed in claim 13, wherein source/drain features of the P-type transistors comprise Ge atomic concentration in a range from about 30% to about 75%.

19. The IC as claimed in claim 13, wherein the first non-SiGe fin, the second non-SiGe fin, and the third non-SiGe fin comprise Si.

20. The IC as claimed in claim 13, wherein the logic cell array comprises inverter, NAND, NOR, Flip-Flop or latch.

* * * * *